United States Patent
Katayama (10) Patent No.: US 7,630,229 B2
(45) Date of Patent: Dec. 8, 2009

(54) SEMICONDUCTOR MEMORY DEVICE

(75) Inventor: Akira Katayama, Fuchu (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 7 days.

(21) Appl. No.: 11/947,241

(22) Filed: Nov. 29, 2007

(65) Prior Publication Data

US 2008/0137465 A1 Jun. 12, 2008

(30) Foreign Application Priority Data

Nov. 30, 2006  (JP)  ............................. 2006-324621

(51) Int. Cl.
 *G11C 11/00* (2006.01)
(52) U.S. Cl. .................. 365/154; 365/226; 365/201
(58) Field of Classification Search ................ 365/154, 365/226, 201, 189.09, 189.08, 185.23, 185.24, 365/89

See application file for complete search history.

(56) References Cited

U.S. PATENT DOCUMENTS

| | | | | |
|---|---|---|---|---|
| 6,657,911 | B2 * | 12/2003 | Yamaoka et al. | 365/226 |
| 7,245,521 | B2 * | 7/2007 | Mori et al. | 365/156 |
| 7,382,674 | B2 * | 6/2008 | Hirabayashi | 365/226 |
| 2007/0121358 | A1 * | 5/2007 | Hirota et al. | 365/1 |
| 2009/0027947 | A1 * | 1/2009 | Takeda | 365/156 |

FOREIGN PATENT DOCUMENTS

JP 2004-5777 1/2004

OTHER PUBLICATIONS

Y. Takeyama et al., "A Low Leakage SRAM Macro with Replica Cell Biasing Scheme", VLSI Circuits 2005, 2 pages.
Kyeong-Sik Min et al., "Row-by-Row Dynamic Source-Line Voltage Control (RRDSV) Scheme for Two orders of Magnitude Leakage Current Reduction of Sub-1-V-$V_{DD}$ SRAM's", Low Power Electronics and Design, 2003 ISLPED. Proceedings of the 2003 International Symposium on Aug. 25-27, 2003, pp. 66-71.
Y. Takeyama et al., "A Low Leakage SRAM Macro with Replica Cell Biasing Scheme", VLSI Circuits 2005, 2 pages.

* cited by examiner

*Primary Examiner*—Dang T Nguyen
(74) *Attorney, Agent, or Firm*—Oblon, Spivak, McClelland, Maier & Neustadt, P.C.

(57) ABSTRACT

A semiconductor memory device includes a memory cell which includes first and second inverter circuits. Each of the first and second inverter circuits includes a load transistor which includes a source connected to a first power supply terminal, and a driving transistor which includes a drain connected to a drain of the load transistor via a memory node, a gate connected to a gate of the load transistor, a source connected to a second power supply terminal, and a back gate connected to a third power supply terminal. A first power supply voltage is applied to the first power supply terminal. A ground voltage is applied to the second power supply terminal. A source voltage higher than the ground voltage is applied to the third power supply terminal.

15 Claims, 6 Drawing Sheets

Power supply control of logic circuit 4

|  | Normal operation mode | Low-voltage mode |
|---|---|---|
| VDDT | Vdd | Vdd-L |
| VSST | 0 | 0 |

Vdd>Vdd-L

FIG. 4

Power supply control of SRAM macro 3

|  | Normal operation mode | Low-voltage mode |
|---|---|---|
| VDDC | Vdd | Vdd |
| VSSC | 0 | Vdd-Vdd-L |
| VSSC-S | 0 | 0 |

Vdd>Vdd-L

Power supply control of peripheral circuit 20

|  | Normal operation mode | Low-voltage mode |
|---|---|---|
| VDDM | Vdd | Vdd |
| VSSM | 0 | 0 |

SEMICONDUCTOR MEMORY DEVICE

CROSS-REFERENCE TO RELATED APPLICATIONS

This application is based upon and claims the benefit of priority from prior Japanese Patent Application No. 2006-324621, filed Nov. 30, 2006, the entire contents of which are incorporated herein by reference.

BACKGROUND OF THE INVENTION

1. Field of the Invention

The present invention relates to a semiconductor memory device and, for example, a semiconductor memory device having static memory cells.

2. Description of the Related Art

Along with the advance in the micropatterning technology for semiconductor elements and the improvement of the performance of semiconductor integrated circuits, high power consumption is becoming a serious problem for recent semiconductor integrated circuits. To solve this problem, a technique of dynamically controlling the operating frequency and power supply voltage in accordance with the load of a data process is employed. More specifically, in a low-load process, power consumption is suppressed by lowering the power supply voltage and operating frequency. To reduce power consumption of a semiconductor integrated circuit by such control, it is important to minimize the operating voltage in the low-load process.

However, in an SRAM (Static Random Access Memory) that is often used as a semiconductor memory in a semiconductor integrated circuit, the voltage margin of a memory cell decreases to make it difficult to execute a low-voltage operation as the device scaling progresses. When an SRAM operates at a low voltage, the static noise margin (SNM) and write margin (WM) representing the characteristic of a memory cell deteriorate, or the cell current decreases.

In a related technique of this kind, the power supply voltage of a memory cell is controlled in accordance with the magnitude of the threshold voltage of a transistor in a static memory cell (Jpn. Pat. Appln. KOKAI Publication No. 2004-5777).

BRIEF SUMMARY OF THE INVENTION

According to a first aspect of the present invention, there is provided a semiconductor memory device comprising:

a first inverter circuit and a second inverter circuit;

a first memory node which is connected to an output of the first inverter circuit and an input of the second inverter circuit; and a second memory node which is connected to an input of the first inverter circuit and an output of the second inverter circuit;

each of the first inverter circuit and the second inverter circuit comprising:

a load transistor which includes a source connected to a first power supply terminal; and a driving transistor which includes a drain connected to a drain of the load transistor via a memory node, a gate connected to a gate of the load transistor, a source connected to a second power supply terminal, and a back gate connected to a third power supply terminal, wherein a first power supply voltage is applied to the first power supply terminal, a ground voltage is applied to the second power supply terminal, and a source voltage higher than the ground voltage is applied to the third power supply terminal.

According to a second aspect of the present invention, there is provided a semiconductor memory device having a first operation mode in which the device operates using a first power supply voltage, and a second operation mode in which the device operates using a second power supply voltage lower than the first power supply voltage, the device comprising:

a memory cell including a first inverter circuit and a second inverter circuit, a first memory node which is connected to an output of the first inverter circuit and an input of the second inverter circuit, and a second memory node which is connected to an input of the first inverter circuit and an output of the second inverter circuit, each of the first inverter circuit and the second inverter circuit comprising a load transistor and a driving transistor which are connected in series; and a power supply controller which applies a source voltage higher than a ground voltage to a source of the driving transistor and applies the ground voltage to a back gate of the driving transistor in the second operation mode.

DETAILED DESCRIPTION OF THE INVENTION

Embodiments of the present invention will be explained below with reference to the accompanying drawing. Note that in the following explanation, the same reference numerals denote elements having the same functions and arrangements, and a repetitive explanation will be made only when necessary.

First Embodiment

Figure 1:
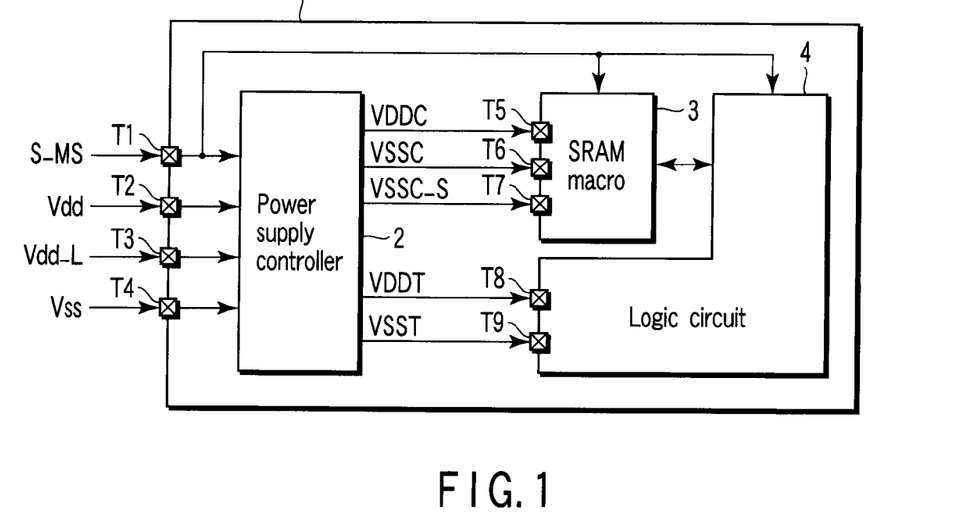
FIG. 1 is a block diagram illustrating the arrangement of a semiconductor integrated circuit 1 according to the first embodiment of the present invention.

FIG. 1 is a block diagram illustrating the arrangement of a semiconductor integrated circuit (chip) 1 according to the first embodiment of the present invention. The semiconductor integrated circuit 1 includes a power supply controller 2, SRAM macro 3, logic circuit 4, and terminals T1 to T4. The semiconductor integrated circuit 1 receives a mode switching signal S_MS to switch its operation mode (normal operation mode and low-voltage mode to be described later) through the terminal T1.

A power supply voltage Vdd, power supply voltage Vdd_L, and ground voltage Vss (0V) are applied to the semiconductor integrated circuit 1 through the terminals T2, T3, and T4, respectively. The semiconductor integrated circuit 1 operates using the two power supply voltages Vdd and Vdd_L. The power supply voltage Vdd_L is set to be higher than the ground voltage Vss and lower than the power supply voltage Vdd.

The semiconductor integrated circuit 1 has two operation modes: normal operation mode (also called a high-speed operation mode) and low-voltage mode (also called a low-speed operation mode). The normal operation mode is used to execute, e.g., a high-speed operation. In the normal operation mode, the semiconductor integrated circuit 1 operates using the power supply voltage Vdd. On the other hand, the low-voltage mode is used to execute an operation at a speed lower than in the normal operation mode. In the low-voltage mode, the semiconductor integrated circuit 1 operates using the power supply voltage Vdd_L. In the low-voltage mode, the semiconductor integrated circuit 1 operates at a frequency (clock) lower than in the normal operation mode. When the power supply voltage (or clock) to be used is changed in accordance with the operation mode, the power consumption of the semiconductor integrated circuit 1 can be reduced as compared to an arrangement that uses the high power supply voltage Vdd in all operations.

The power supply controller 2 applies various voltages to the SRAM macro 3 and logic circuit 4 in accordance with the operation mode. The power supply voltages Vdd and Vdd_L and ground voltage Vss are applied to the power supply controller 2. The power supply controller 2 applies a high-potential-side source voltage VDDC, low-potential-side source voltage VSSC, and substrate voltage VSSC_S to the SRAM macro 3. The power supply controller 2 applies a power supply voltage VDDT and ground voltage VSST to the logic circuit 4.

The logic circuit 4 controls the operation of the SRAM macro 3 and the operation of the entire semiconductor integrated circuit 1. The logic circuit 4 also inputs data (writes data) to the SRAM macro 3 or outputs data (reads data) from the SRAM macro 3. The logic circuit 4 has terminals T8 and T9 to receive the power supply voltage VDDT and ground voltage VSST, respectively. The logic circuit 4 operates using the power supply voltage VDDT and ground voltage VSST.

Figure 2:
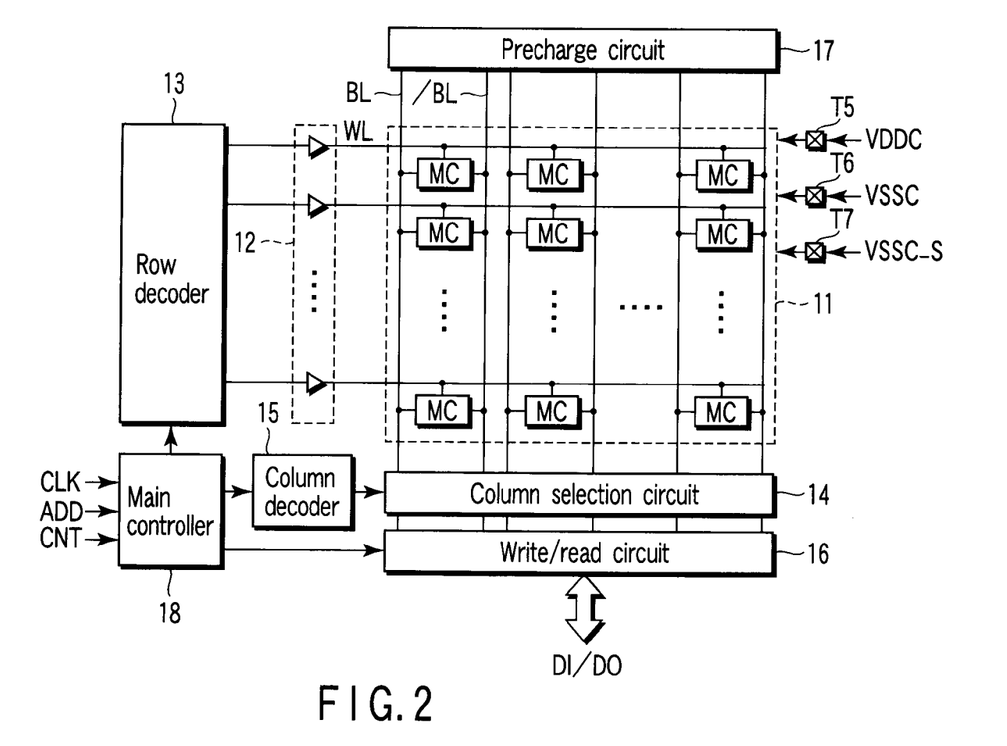
FIG. 2 is a block diagram illustrating an example of an SRAM macro 3 shown in FIG. 1.

The SRAM macro 3 corresponds to a memory unit for storing data in the semiconductor integrated circuit 1. The SRAM macro 3 is a block functioning as a memory and includes a decoder, driver, and the like to read or write data in or from a memory cell array that stores data. The SRAM macro 3 has terminals T5, T6, and T7 to receive the source voltages VDDC and VSSC and substrate voltage VSSC_S, respectively. The SRAM macro 3 operates using the source voltages VDDC and VSSC and substrate voltage VSSC_S. FIG. 2 is a block diagram illustrating an example of the SRAM macro 3.

The SRAM macro 3 has a memory cell array 11 including a plurality of static memory cells MC. The memory cell array 11 has a plurality of word lines WL running in the row direction. The memory cell array 11 has a plurality of pairs of bit lines BL and /BL running in the column direction. The word lines WL select rows in the memory cell array 11. The pairs of bit lines BL and /BL select columns in the memory cell array 11.

A row decoder 13 is connected to the plurality of word lines WL via a word line driver 12. The row decoder 13 selects a corresponding word line WL on the basis of a row address signal.

A column selection circuit 14 is connected to the plurality of pairs of bit lines BL and /BL. A column decoder 15 supplies a column selection signal to the column selection circuit 14 on the basis of a column address signal. The column selection circuit 14 selects a corresponding pair of bit lines BL and /BL on the basis of the column selection signal.

A write/read circuit 16 is connected to the column selection circuit 14. The write/read circuit 16 writes or reads data to or from a column selected by the column selection circuit 14. More specifically, the write circuit writes input data DI from the logic circuit 4 to the memory cell array 11 as write data. The read circuit detects and amplifies read data transferred from the memory cell array 11 to the pair of bit lines BL and /BL and outputs the read data to the logic circuit 4 as output data DO.

A precharge circuit 17 precharges all pairs of local bit lines BL and /BL to a predetermined voltage (e.g., power supply voltage Vdd) before read and write operations are executed. The precharge circuit 17 executes the precharge operation on the basis of a precharge signal supplied from a main controller 18. That is, the precharge circuit 17 precharges the pairs of bit lines BL and /BL to the predetermined voltage (e.g., power supply voltage Vdd) when the precharge signal is activated, and cancels precharging when the precharge signal is deactivated.

The main controller 18 controls the circuits in the SRAM macro. The main controller 18 receives a clock signal CLK, address signal ADD, and control signal CNT from the logic circuit 4. On the basis of the address signal ADD, the main controller 18 generates the row address signal to be supplied to the row decoder 13 and the column address signal to be supplied to the column decoder 15. The main controller 18 also controls the precharge operation, write operation, and read operation based on, e.g., the control signal CNT.

As described above, the SRAM macro 3 operates using the source voltages VDDC and VSSC and substrate voltage VSSC_S. The source voltage VDDC is used as the high-potential-side power supply voltage. The source voltage VSSC is used as the low-potential-side power supply voltage (ground voltage). Hence, a peripheral circuit connected to the bit lines BL and word lines WL sets their voltages by using the source voltages VDDC and VSSC.

Figure 3:
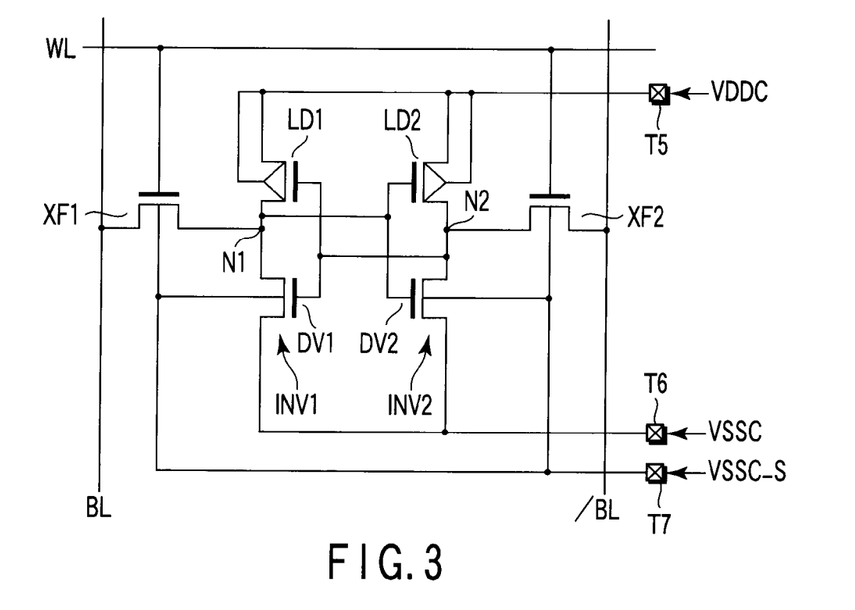
FIG. 3 is a circuit diagram illustrating the arrangement of a memory cell MC shown in FIG. 2.

FIG. 3 is a circuit diagram illustrating the arrangement of the memory cell MC shown in FIG. 2. The memory cell MC is a 6-Tr SRAM cell including six MOS transistors.

The memory cell MC includes a first inverter circuit INV1 and second inverter circuit INV2. The first inverter circuit INV1 comprises a p-channel MOS transistor (PMOS transistor) LD1 as a load and an n-channel MOS transistor (NMOS transistor) DV1 for driving. The PMOS transistor LD1 and NMOS transistor DV1 are connected in series between the terminal T5 that receives the source voltage VDDC and the terminal T6 that receives the source voltage VSSC.

The second inverter circuit INV2 comprises a PMOS transistor LD2 as a load and an NMOS transistor DV2 for driving. The PMOS transistor LD2 and NMOS transistor DV2 are connected in series between the terminals T5 and T6.

More specifically, the source terminal and back gate terminal (also called a substrate terminal) of the PMOS transistor LD1 are connected to the terminal T5. The drain terminal of the PMOS transistor LD1 is connected to the drain terminal of the NMOS transistor DV1 via a memory node N1. The gate terminal of the PMOS transistor LD1 is connected to the gate terminal of the NMOS transistor DV1. The source terminal of the NMOS transistor DV1 is connected to the terminal T6. The back gate terminal of the NMOS transistor DV1 is connected to the terminal T7 that receives the substrate voltage VSSC_S.

The source terminal and back gate terminal of the PMOS transistor LD2 are connected to the terminal T5. The drain terminal of the PMOS transistor LD2 is connected to the drain terminal of the NMOS transistor DV2 via a memory node N2. The gate terminal of the PMOS transistor LD2 is connected to the gate terminal of the NMOS transistor DV2. The source terminal of the NMOS transistor DV2 is connected to the terminal T6. The back gate terminal of the NMOS transistor DV2 is connected to the terminal T7.

The gate terminal of the PMOS transistor LD1 is connected to the memory node N2. The gate terminal of the PMOS transistor LD2 is connected to the memory node N1. In other words, the output terminal of the first inverter circuit INV1 is connected to the input terminal of the second inverter circuit INV2, and the output terminal of the second inverter circuit INV2 is connected to the input terminal of the first inverter circuit INV1.

The memory node N1 is connected to the bit line BL via a transfer gate (NMOS transistor for transfer) XF1 that is an NMOS transistor. The gate terminal of the transfer gate XF1 is connected to the word line WL. The back gate terminal of the transfer gate XF1 is connected to the terminal T7.

The memory node N2 is connected to the bit line /BL via a transfer gate (NMOS transistor for transfer) XF2 that is an NMOS transistor. The gate terminal of the transfer gate XF2 is connected to the word line WL. The back gate terminal of the transfer gate XF2 is connected to the terminal T7.

The operation of the semiconductor integrated circuit 1 having the above-described arrangement will be described. First, the operation mode (normal operation mode or low-voltage mode) of the semiconductor integrated circuit 1 is set by the mode switching signal S_MS. The mode switching signal S_MS is input to the power supply controller 2. The mode switching signal S_MS is also input to the SRAM macro 3 and logic circuit 4 as needed. In accordance with the operation mode, the power supply controller 2 applies predetermined voltages to the SRAM macro 3 and logic circuit 4.

Figure 4:
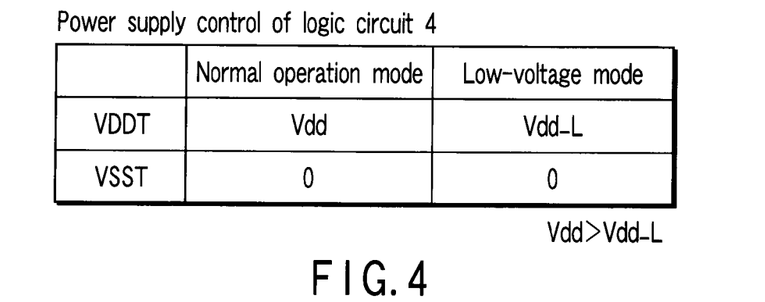
FIG. 4 is a table illustrating voltages applied from a power supply controller 2 to a logic circuit 4 in accordance with an operation mode.

FIG. 4 is a table illustrating voltages applied from the power supply controller 2 to the logic circuit 4 in accordance with an operation mode. In the normal operation mode, the power supply controller 2 applies, to the logic circuit 4, Vdd as the power supply voltage VDDT and Vss (0V) as the ground voltage VSST. This allows the logic circuit 4 to execute a high-speed operation.

In the low-voltage mode, the power supply controller 2 applies, to the logic circuit 4, Vdd_L as the power supply voltage VDDT and Vss (0V) as the ground voltage VSST. This allows the logic circuit 4 to execute a low-speed operation and reduce power consumption.

Figure 5:
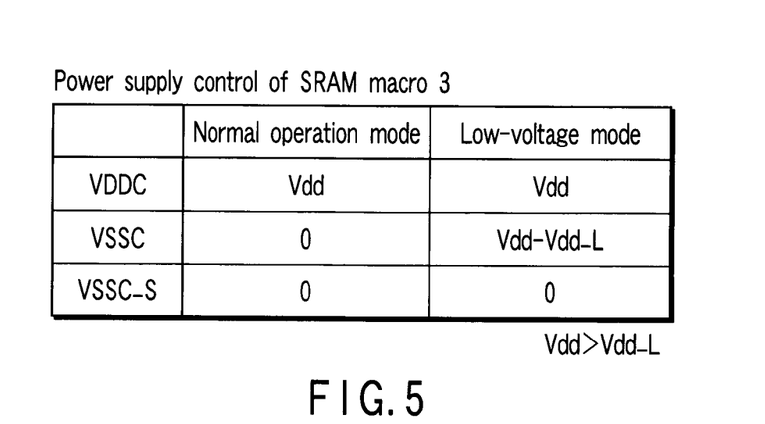
FIG. 5 is a table illustrating voltages applied from the power supply controller 2 to the SRAM macro 3 in accordance with an operation mode.

FIG. 5 is a table illustrating voltages applied from the power supply controller 2 to the SRAM macro 3 in accordance with an operation mode. In the normal operation mode, the power supply controller 2 applies, to the SRAM macro 3, Vdd as the source voltage VDDC, Vss (0V) as the source voltage VSSC, and Vss (0V) as the substrate voltage VSSC_S. This allows the SRAM macro 3 to execute a high-speed operation. In the memory cell MC, the static noise margin (SNM) and write margin (WM) representing the characteristic of the cell improve, and a sufficient cell current can be ensured.

In the low-voltage mode, the power supply controller 2 applies, to the SRAM macro 3, Vdd as the source voltage VDDC, "Vdd−Vdd_L" as the source voltage VSSC, and Vss (0V) as the substrate voltage VSSC_S. The static noise margin (SNM) and write margin (WM) of the memory cell MC when the above-described power control is done in the low-voltage mode will be described below.

Figure 6:
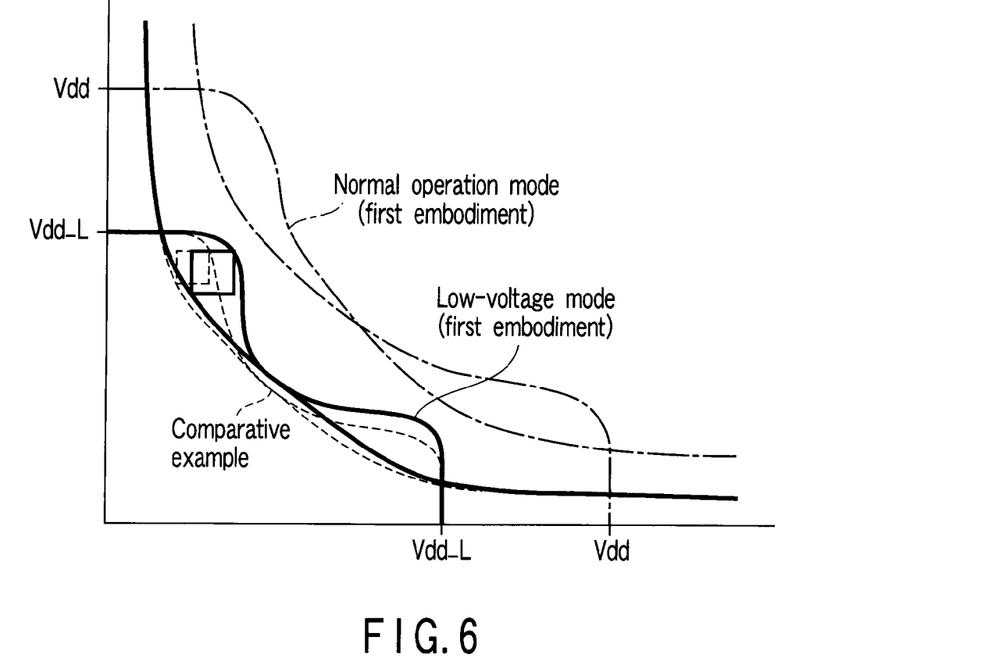
FIG. 6 is a graph illustrating the static noise margin (SNM) of the memory cell MC according to the first embodiment.

FIG. 6 is a graph illustrating the static noise margin (SNM) of the memory cell MC. The curves (butterfly curves) shown in FIG. 6 are obtained by superimposing the input/output characteristics of the two inverter circuits INV1 and INV2 included in the memory cell MC. At this time, the word line WL is selected, and the pair of bit lines BL and /BL is set at high level. The ordinate and abscissa of FIG. 6 represent voltages applied to the memory cell MC.

FIG. 6 shows butterfly curves in the normal operation mode (VDDC=Vdd, VSSC=0V, and VSSC_S=0V) and in the low-voltage mode (VDDC=Vdd, VSSC=Vdd−Vdd_L, and VSSC_S=0V). FIG. 6 also shows, as a comparative example, butterfly curves without application of this embodiment (VDDC=Vdd_L, VSSC=0V, and VSSC_S=0V).

The length of the maximum square inscribed in two regions surrounded by two curves is called a static noise margin (SNM). The static noise margin (SNM) serves as an index representing the stability of stored data. Generally, the larger the static noise margin (SNM) is, the higher the stability of data stored in an SRAM cell is so that data destruction by, e.g., power supply voltage noise in the chip rarely occurs. Hence, how to increase the static noise margin (SNM) is important in designing an SRAM cell.

Figure 7:
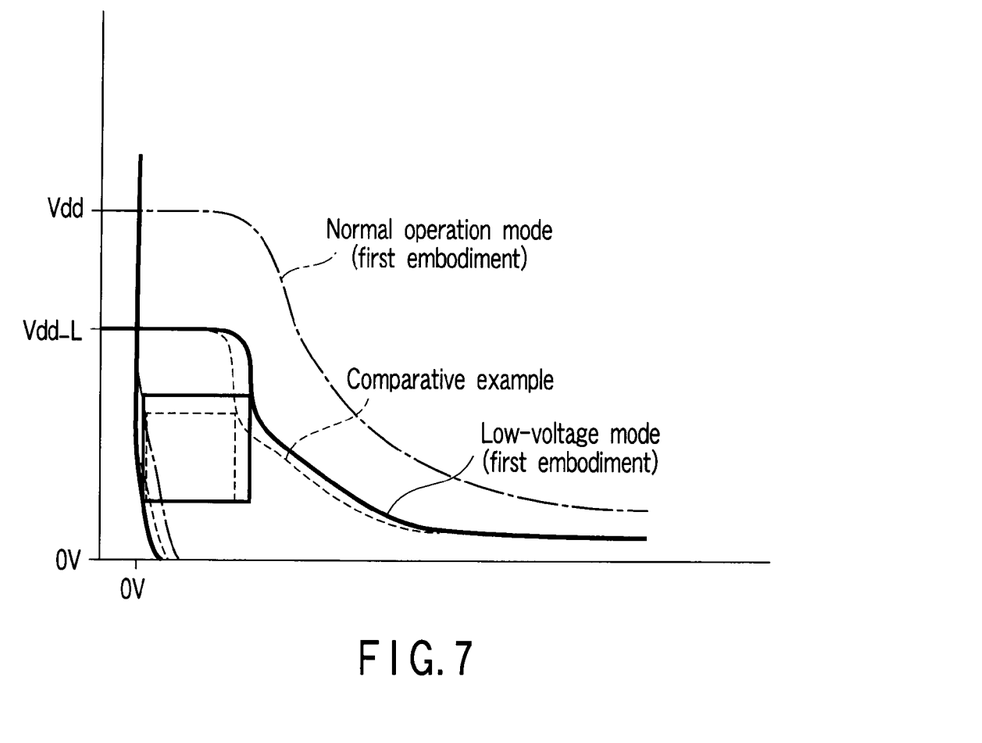
FIG. 7 is a graph illustrating the write margin (WM) of the memory cell MC according to the first embodiment.

FIG. 7 is a graph illustrating the write margin (WM) of the memory cell MC. The ordinate and abscissa of FIG. 7 represent voltages applied to the memory cell MC. The curves shown in FIG. 7 are obtained by superimposing the input/output characteristics of the two inverter circuits INV1 and INV2 when the word line WL is selected, one bit line is set at high level, and the other bit line is set at low level. The length of the minimum inscribed square which has diagonal lines under the straight line of Vin=Vout between the curves is called a write margin (WM). The write margin (WM) serves as an index representing data writability.

FIG. 7 shows input/output characteristics in the normal operation mode (VDDC=Vdd, VSSC=0V, and VSSC_S=0V) and in the low-voltage mode (VDDC=Vdd, VSSC=Vdd−Vdd_L, and VSSC_S=0V). FIG. 7 also shows, as a comparative example, input/output characteristics without application of this embodiment (VDDC=Vdd_L, VSSC=0V, and VSSC_S=0V).

Normally, in the low-voltage mode, the power supply voltage drops. Hence, the SNM and WM deteriorate as compared to the normal operation mode. The deterioration of the SNM and WM can be suppressed by adjusting the threshold voltage of the drivers DV1 and DV2 and transfer gates XF1 and XF2 of the memory cell MC. The threshold voltage of the drivers and transfer gates can be changed by, e.g., adjusting the voltage of the substrate on which the MOS transistors are formed. In adjusting the threshold voltage based on the substrate voltage, switching in a short period (between the read and the write) is difficult because of the large capacity of the substrate. However, since the switching from the normal operation mode to the low-voltage mode is done in a long period, the SNM and WM can be improved by using the substrate voltage.

In a general SRAM cell, the SNM, WM, and cell current are optimized in accordance with the power supply voltage in the normal operation mode. Hence, in this embodiment, the semiconductor integrated circuit has a function of suppressing deterioration of the SNM and WM of the memory cell MC in the low-voltage mode. More specifically, the threshold voltage of the drivers DV1 and DV2 is raised in the low-voltage mode, thereby shifting the falling edge of the input/output characteristic shown in FIGS. 6 and 7 to the right side, as compared to the comparative example.

To raise the threshold voltage of the drivers DV1 and DV2, it is necessary to make the substrate voltage VSSC_S lower than the source voltage VDDC of the drivers. In this embodiment, the source voltage VDDC of the SRAM macro 3 is disconnected from the power supply voltage VDDT of the logic circuit 4 in the low-voltage mode. Additionally, the source voltage VSSC of the SRAM macro 3 is made higher than the ground voltage Vss (0V), thereby lowering the voltage (i.e., VDDC-VSSC) applied to the memory cell MC. The substrate voltage is fixed at 0V.

This power supply control achieves a state wherein the substrate voltage VSSC_S is lower than the source voltage VSSC in the low-voltage mode. Hence, the threshold voltage of the drivers DV1 and DV2 and transfer gates XF1 and XF2 can be raised. It is therefore possible to improve the SNM and WM of the memory cell MC.

The voltage (VDDC–VSSC) applied to the memory cell MC in the low-voltage mode is Vdd_L. Hence, the power consumption can be reduced as compared to the normal operation mode. More specifically, the power consumption of the memory cell MC can be suppressed to the same level as in an operation under the conditions (VDDC=Vdd_L, VSSC=0V, and VSSC_S=0V) of the comparative example.

It is also possible to achieve a state wherein the substrate voltage VSSC_S is lower than the source voltage VSSC without using a negative power supply voltage for the substrate voltage VSSC_S. Hence, the kinds of power supply voltages applied to the semiconductor integrated circuit 1 do not increase. That is, it is unnecessary to provide a new step-up circuit or step-down circuit.

Figure 8:
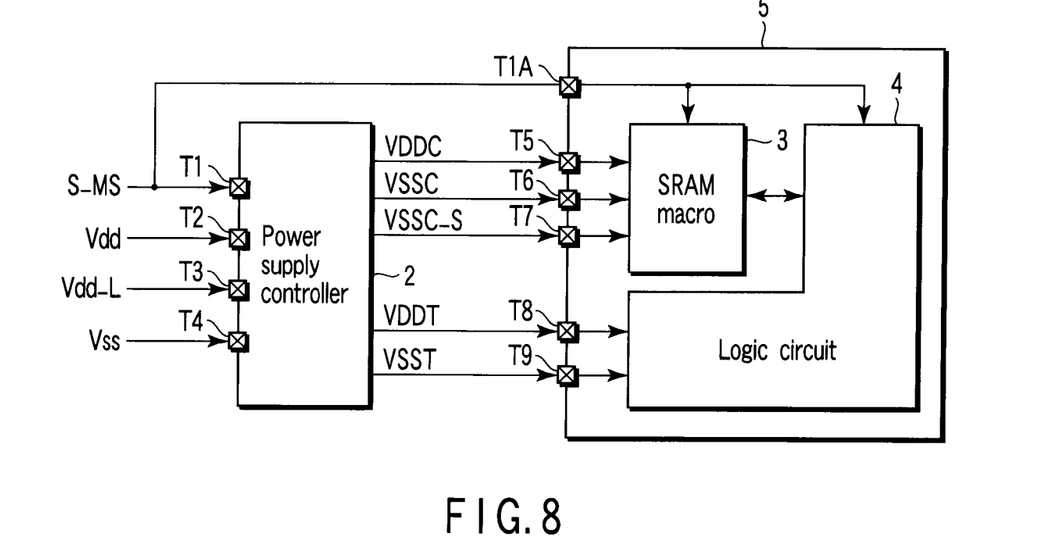
FIG. 8 is a block diagram illustrating another arrangement of the semiconductor integrated circuit according to the first embodiment.

Note that a semiconductor integrated circuit (chip) 5 may include only the SRAM macro 3 and logic circuit 4, and the power supply controller 2 may be arranged outside the chip 5. FIG. 8 is a block diagram illustrating another arrangement of the semiconductor integrated circuit according to the first embodiment.

In this arrangement, the power supply controller 2 has the terminals T1 to T4 to receive the mode switching signal S_MS, power supply voltage Vdd, power supply voltage Vdd_L, and ground voltage Vss, respectively. The operation of the power supply controller 2 is the same as that of the power supply controller 2 shown in FIG. 1.

The chip 5 has the terminals T5 to T9 to receive the source voltage VDDC, source voltage VSSC, substrate voltage VSSC_S, power supply voltage VDDT, and ground voltage VSST, respectively. The chip 5 also has a terminal T1A which receives the mode switching signal S_MS. The source voltages VDDC and VSSC and substrate voltage VSSC_S are applied to the SRAM macro 3. The power supply voltage VDDT and ground voltage VSST are applied to the logic circuit 4. The mode switching signal S_MS is supplied to the SRAM macro 3 and logic circuit 4. The operations of the SRAM macro 3 and logic circuit 4 are the same as those of the SRAM macro 3 and logic circuit 4 shown in FIG. 1. Even the semiconductor device with this arrangement can provide the same effect as described above.

Second Embodiment

In the second embodiment, a memory cell array 11 and peripheral circuit 20 in an SRAM macro 3 are separately subjected to power supply control. Source voltages VDDC and VSSC and substrate voltage VSSC_S are applied to the memory cell array 11, as in the first embodiment. On the other hand, a power supply voltage Vdd and ground voltage Vss (0V) are applied to the peripheral circuit 20 in a low-voltage mode.

Figure 9:
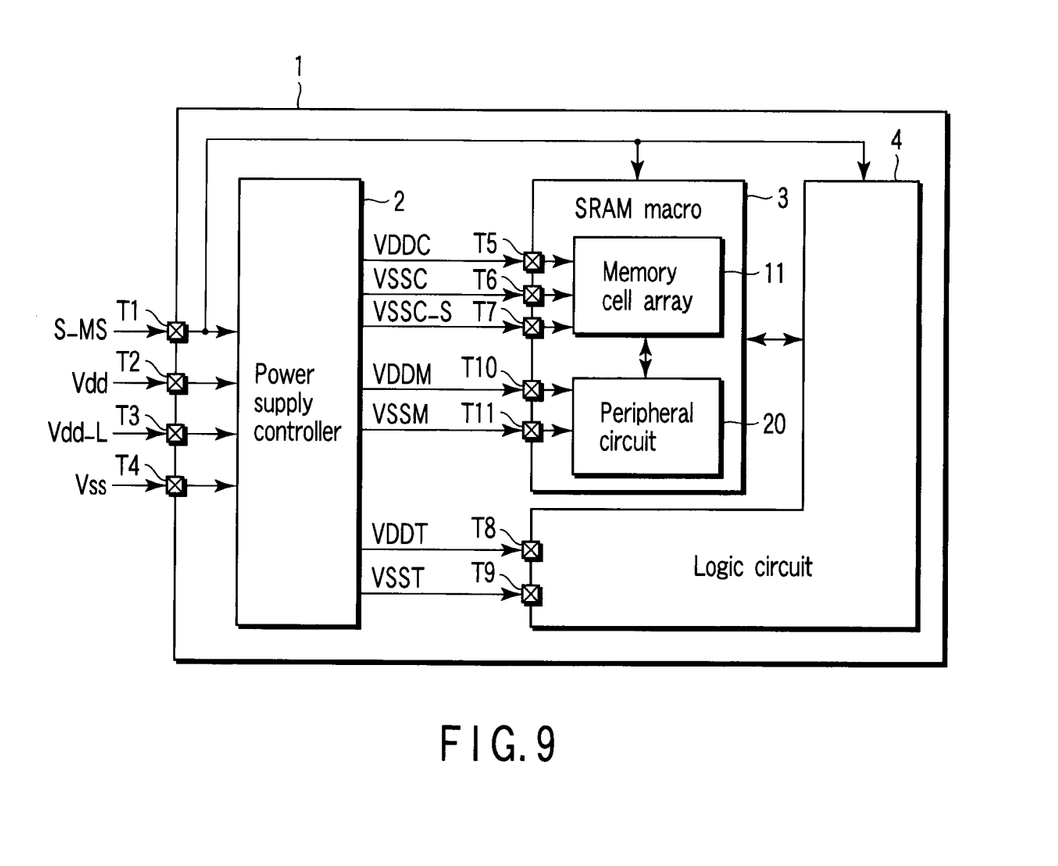
FIG. 9 is a block diagram illustrating the arrangement of a semiconductor integrated circuit 1 according to the second embodiment of the present invention.

FIG. 9 is a block diagram illustrating the arrangement of a semiconductor integrated circuit 1 according to the second embodiment of the present invention. A power supply controller 2 applies, to the SRAM macro 3, a power supply voltage VDDM and ground voltage VSSM in addition to the voltages (source voltages VDDC and VSSC and substrate voltage VSSC_S) described in the first embodiment.

The SRAM macro 3 includes the memory cell array 11 and peripheral circuit 20. The peripheral circuit 20 corresponds to circuits (i.e., word line driver 12, write/read circuit 16, precharge circuit 17, and the like) other than the memory cell array 11 of the SRAM macro 3 shown in FIG. 2. The SRAM macro 3 has terminals T10 and T11 to receive the power supply voltage VDDM and ground voltage VSSM.

Of the voltages applied from the power supply controller 2 to the SRAM macro 3, the source voltages VDDC and VSSC and substrate voltage VSSC_S are applied to the memory cell array 11. The memory cell array 11 operates using the source voltages VDDC and VSSC and substrate voltage VSSC_S.

Of the voltages applied from the power supply controller 2 to the SRAM macro 3, the power supply voltage VDDM and ground voltage VSSM are applied to the peripheral circuit 20. The peripheral circuit 20 operates using the power supply voltage VDDM and ground voltage VSSM.

The operation of the semiconductor integrated circuit 1 having the above-described arrangement will be described. First, the operation mode (normal operation mode or low-voltage mode) of the semiconductor integrated circuit 1 is set by a mode switching signal S_MS. The mode switching signal S_MS is input to the power supply controller 2, SRAM macro 3, and logic circuit 4. In accordance with the operation mode, the power supply controller 2 applies predetermined voltages to the SRAM macro 3 and logic circuit 4.

The voltages applied from the power supply controller 2 to the logic circuit 4 in accordance with an operation mode are the same as in FIG. 4 of the first embodiment. The source voltages VDDC and VSSC and substrate voltage VSSC_S applied from the power supply controller 2 to the memory cell array 11 in accordance with an operation mode are the same as in FIG. 5.

Figure 10:
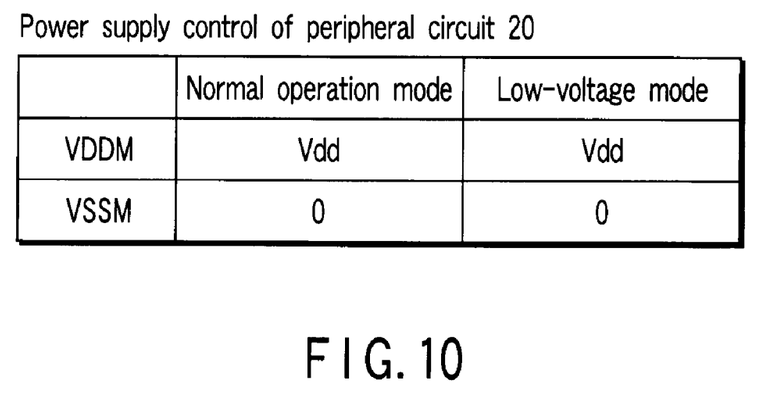
FIG. 10 is a table illustrating voltages applied from a power supply controller 2 to a peripheral circuit 20 in accordance with an operation mode.

FIG. 10 is a table illustrating voltages applied from the power supply controller 2 to the peripheral circuit 20 in accordance with an operation mode. In the normal operation mode, the power supply controller 2 applies, to the peripheral circuit 20, Vdd as the power supply voltage VDDM and Vss as the ground voltage VSSM. In the low-voltage mode, the power supply controller 2 applies, to the peripheral circuit 20, Vdd as the power supply voltage VDDM and Vss as the ground voltage VSSM. Hence, the peripheral circuit 20 connected to a bit line BL sets the voltage of the bit line BL to the power supply voltage Vdd or ground voltage Vss in accordance with data. Similarly, the peripheral circuit 20 connected to a word line WL sets the voltage of the word line WL to the power supply voltage Vdd or ground voltage Vss in accordance with selection/unselection.

Figure 11:
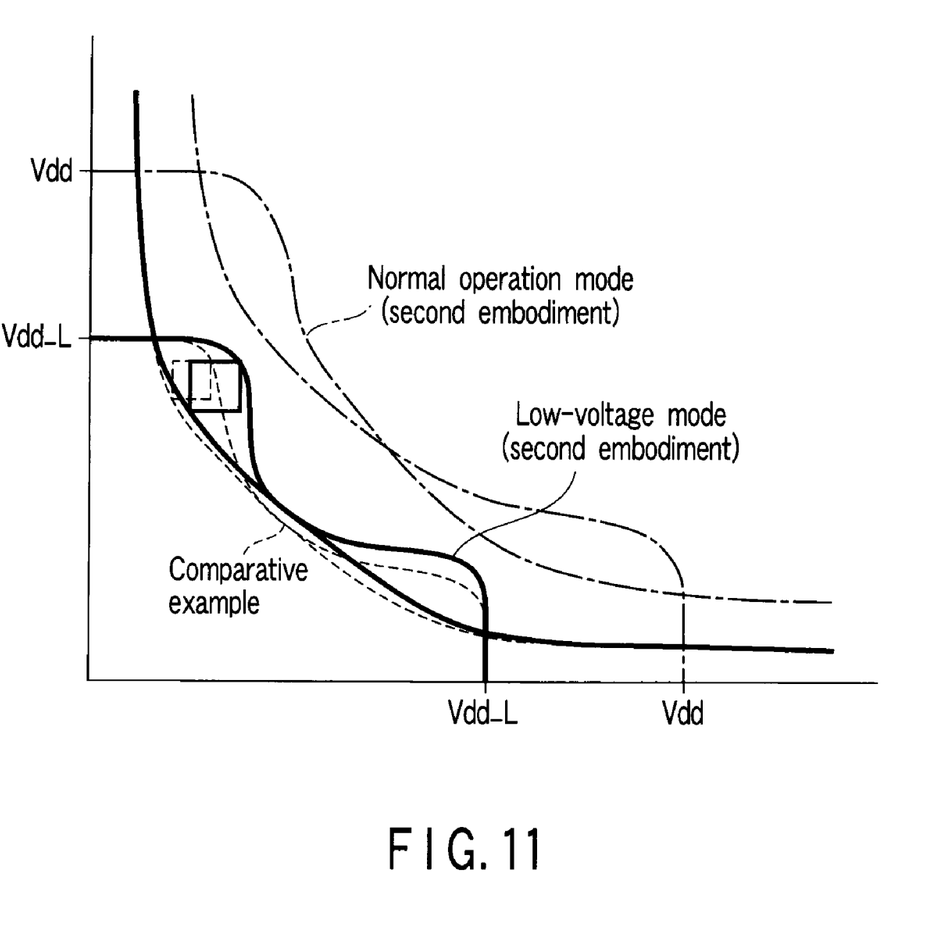
FIG. 11 is a graph illustrating the static noise margin (SNM) of a memory cell MC according to the second embodiment.

The SNM and WM of a memory cell MC when the above-described power supply control is done in the low-voltage mode will be described below. FIG. 11 is a graph illustrating the static noise margin (SNM) of the memory cell MC. The ordinate and abscissa of FIG. 11 represent voltages applied to the memory cell MC. As shown in FIG. 11, the SNM in the low-voltage mode improves as compared to a comparative example. The conditions of the comparative example are the same as those of the comparative example described in the first embodiment.

Figure 12:
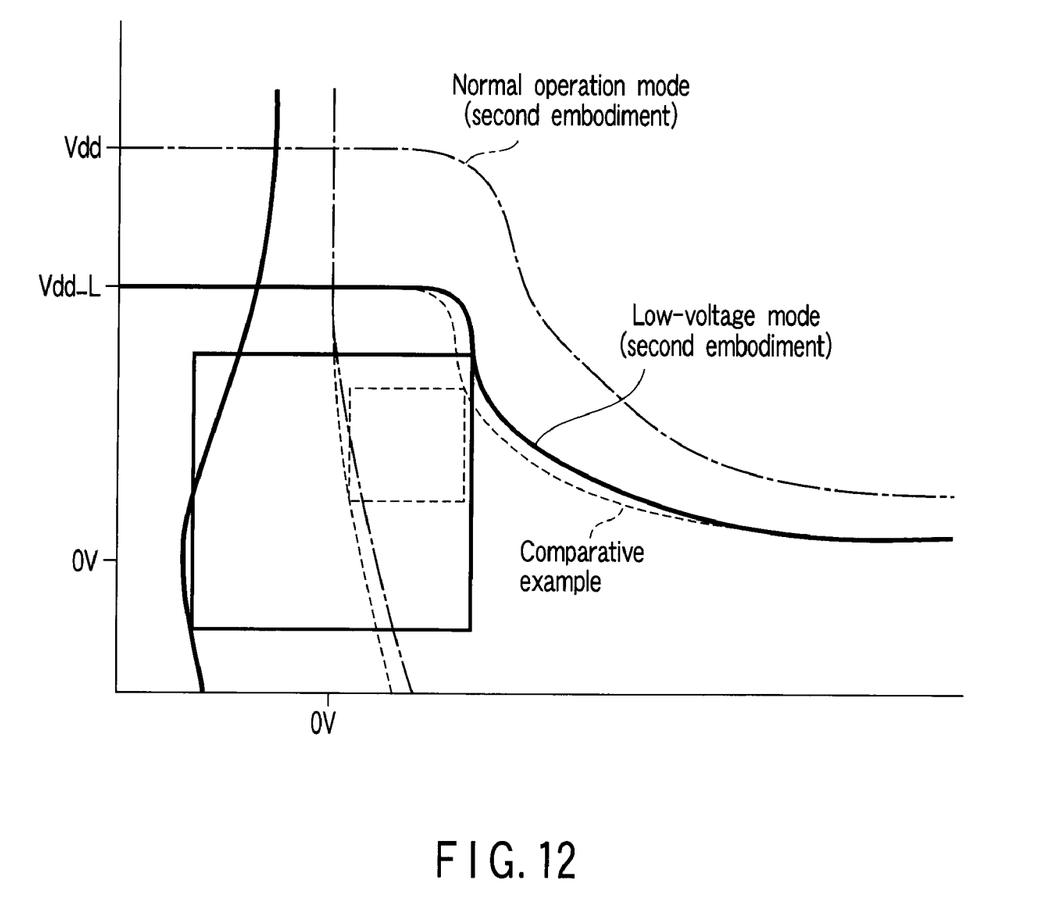
FIG. 12 is a graph illustrating the write margin (WM) of the memory cell MC according to the second embodiment.

FIG. 12 is a graph illustrating the write margin (WM) of the memory cell MC. The ordinate and abscissa of FIG. 12 represent voltages applied to the memory cell MC. In the low-voltage mode, the source voltage VSSC of the memory cell MC is set to Vdd−Vdd_L. For example when the bit line BL is set at 0V, the voltage of the bit line BL is lower than the source voltage VSSC by Vdd−Vdd_L on the basis of the memory cell MC. This allows to shift one of the curves in the low-voltage mode shown in FIG. 12 to the negative side (left side). It is therefore possible to largely improve the WM in the low-voltage mode as compared to the comparative example.

When the word line WL is unselected, its voltage is 0V. On the other hand, the source voltage VSSC of the memory cell MC is Vdd−Vdd_L. The voltage of the word line WL is lower than the source voltage VSSC by Vdd−Vdd_L on the basis of the memory cell MC. This allows to reduce the off leakage current of transfer gates XF1 and XF2 connected to the word line WL. That is, the leakage current of the memory cell MC can be reduced. It is therefore possible to improve the data hold characteristic of the memory cell MC.

Even in the second embodiment, the voltage (VDDC-VSSC) applied to the memory cell MC in the low-voltage mode is Vdd_L. Hence, the power consumption of the memory cell MC can be reduced as compared to the normal operation mode.

Even in the second embodiment, a semiconductor integrated circuit (chip) 5 may include only the SRAM macro 3 and logic circuit 4, and the power supply controller 2 may be arranged outside the chip 5, as on the first embodiment.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device including a first operation mode in which a logic circuit operates at a first power supply voltage, and a second operation mode in which the logic circuit operates at a second power supply voltage lower than the first power supply voltage, the first power supply voltage and the second power supply voltage being higher power than a ground voltage, the device comprising:
a first inverter circuit and a second inverter circuit;
a first memory node which is connected to an output of the first inverter circuit and an input of the second inverter circuit; and
a second memory node which is connected to an input of the first inverter circuit and an output of the second inverter circuit;
each of the first inverter circuit and the second inverter circuit comprising:
a load transistor which includes a source connected to a first power supply terminal; and
a driving transistor which includes a drain connected to a drain of the load transistor via a memory node, a gate connected to a gate of the load transistor, a source connected to a second power supply terminal, and a back gate connected to a third power supply terminal,
wherein the first power supply voltage is applied to the first power supply terminal,
a source voltage higher than the ground voltage is applied to the second power supply terminal, and the ground voltage is applied to the third power supply terminal; and
wherein the source voltage is set to a value obtained by subtracting the second power supply voltage from the first power supply voltage.

2. The device according to claim 1, further comprising:
a first transfer transistor which is connected between the first memory node and a first bit line and includes a gate connected to a word line and a back gate connected to the third power supply terminal; and
a second transfer transistor which is connected between the second memory node and a second bit line and includes a gate connected to the word line and a back gate connected to the third power supply terminal.

3. The device according to claim 2, wherein the first bit line and the second bit line are set at one of the first power supply voltage and the ground voltage in accordance with data.

4. The device according to claim 2, wherein the word line is set at the first power supply voltage in a selected state and at the ground voltage in an unselected state.

5. A semiconductor memory device comprising:
a logic circuit operating at a first power supply voltage in a first operation mode, and operating at a second power supply voltage lower than the first power supply voltage, in a second operation mode, the first power supply voltage and the second power supply voltage being higher power than a ground voltage;
a memory cell including a first inverter circuit and a second inverter circuit, a first memory node which is connected to an output of the first inverter circuit and an input of the second inverter circuit, and a second memory node which is connected to an input of the first inverter circuit and an output of the second inverter circuit, each of the first inverter circuit and the second inverter circuit comprising a load transistor and a driving transistor which are connected in series;
a power supply controller which applies a source voltage higher than the ground voltage to a source of the driving transistor and applies the ground voltage to a back gate of the driving transistor in the second operation mode; and
wherein the source voltage set to a value obtained by subtracting the second power supply voltage from the first power supply voltage.

6. The device according to claim 5, wherein the power supply controller applies the first power supply voltage to a source of the load transistor in the second operation mode.

7. The device according to claim 5, wherein the power supply controller applies the first power supply voltage to a source of the load transistor and applies the ground voltage to the source and the back gate of the driving transistor in the first operation mode.

8. The device according to claim 5, wherein a threshold voltage of the driving transistor is higher in the second operation mode than in the first operation mode.

9. The device according to claim 5,
wherein the logic circuit sends data to the memory cell and receives data from the memory cell, and
the power supply controller applies the first power supply voltage to the logic circuit in the first operation mode and applies the second power supply voltage to the logic circuit in the second operation mode.

10. The device according to claim 5, further comprising:
a first transfer transistor which is connected between the first memory node and a first bit line and includes a gate connected to a word line; and
a second transfer transistor which is connected between the second memory node and a second bit line and includes a gate connected to the word line.

11. The device according to claim 10, wherein the power supply controller applies the source voltage to back gates of the first transfer transistor and the second transfer transistor in the second operation mode.

12. The device according to claim 10, wherein the power supply controller applies the ground voltage to back gates of the first transfer transistor and the second transfer transistor in the first operation mode.

13. The device according to claim 10, which further comprises a peripheral circuit which reads data from the memory cell and writes data to the memory cell, and
in which the power supply controller applies the first power supply voltage and the ground voltage to the peripheral circuit in the second operation mode, and
the peripheral circuit sets voltages of the first bit line, the second bit line, and the word line to one of the first power supply voltage and the ground voltage.

14. The device according to claim 13,
wherein the logic circuit sends data to the peripheral circuit and receives data from the peripheral circuit, and
the power supply controller applies the first power supply voltage to the logic circuit in the first operation mode and applies the second power supply voltage to the logic circuit in the second operation mode.

15. The device according to claim 1, wherein
the source voltage is applied to the second power supply terminal in the second operation mode, and
the ground voltage is applied to the second power supply terminal in the first operation mode.

* * * * *